(12) United States Patent
Grisoni

(10) Patent No.: US 7,015,601 B2
(45) Date of Patent: Mar. 21, 2006

(54) SOLID STATE CURRENT DISTRIBUTION SYSTEM FOR DC VOLTAGES

(76) Inventor: Massimo Grisoni, Via G. Ferri 27, Lugano (CH)

( * ) Notice: Subject to any disclaimer, the term of this patent is extended or adjusted under 35 U.S.C. 154(b) by 290 days.

(21) Appl. No.: 10/053,259

(22) Filed: Jan. 18, 2002

(65) Prior Publication Data

US 2002/0109951 A1 Aug. 15, 2002

(30) Foreign Application Priority Data

Jan. 22, 2001 (IT) ................................. BS2001A000004

(51) Int. Cl.
*H01B 11/02* (2006.01)

(52) U.S. Cl. ..................................................... 307/147
(58) Field of Classification Search ................. 307/126, 307/139, 140, 147, 31, 35, 85, 116; 361/648, 361/42, 45, 79; 363/144
See application file for complete search history.

(56) References Cited

U.S. PATENT DOCUMENTS

| 3,851,218 A | * | 11/1974 | York ........................... 361/101 |
| 4,801,828 A | * | 1/1989 | Ishikawa et al. ............. 327/462 |
| 5,170,360 A | * | 12/1992 | Porter et al. ................. 700/293 |
| 5,600,536 A | * | 2/1997 | Newsome et al. ........... 361/648 |
| 6,456,515 B1 | * | 9/2002 | Rose, Sr. ..................... 363/144 |
| 2004/0184207 A1 | * | 9/2004 | DiSalvo et al. ............... 361/42 |

* cited by examiner

*Primary Examiner*—Robert L. DeBeradinis
(74) *Attorney, Agent, or Firm*—Shoemaker and Mattare

(57) ABSTRACT

The invention concerns a solid state current distribution system for DC voltages comprising an electronic solid state switch (13) for current switching from an input circuit powered by a voltage source to an output circuit connected to a load. The switch is connected to a first copper support (11) soldered to the case of the electronic switch and connected to the input circuit. An electronic printed board (14) is provided for the control of the electronic solid state switch, and a second copper support (12) is connected to the output terminals and to the load.

20 Claims, 1 Drawing Sheet

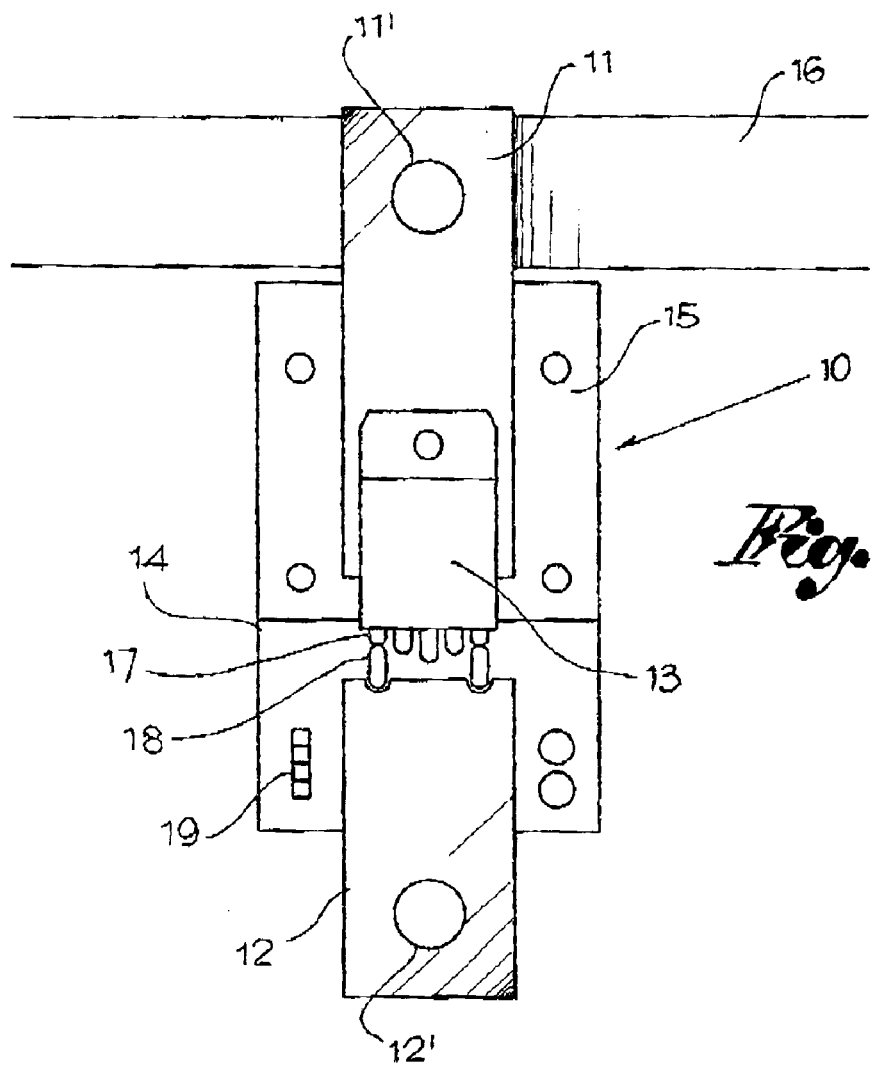
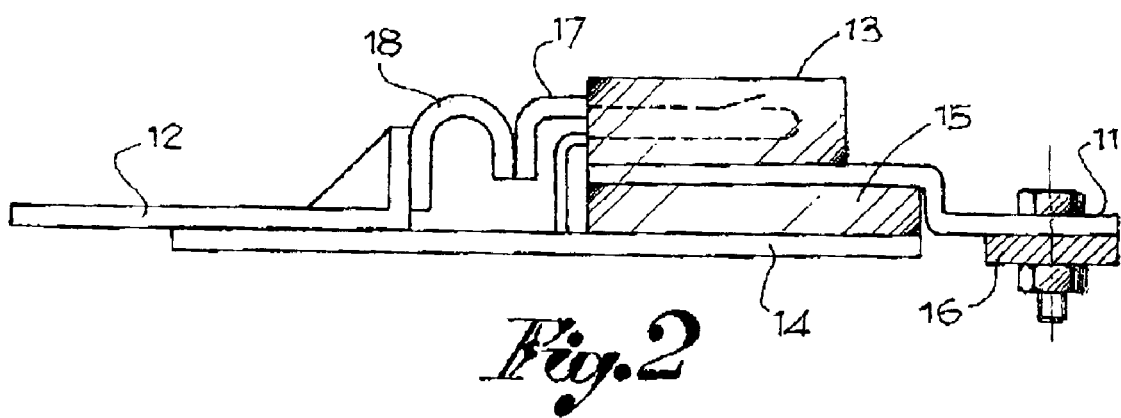

SOLID STATE CURRENT DISTRIBUTION SYSTEM FOR DC VOLTAGES

FIELD OF THE INVENTION

The present invention relates generally to a distribution and controlling system for DC voltages in electrical installations, hereinafter also called in short a DCS system.

BACKGROUND OF THE INVENTION

Generally the currents distributed in an electrical installation are controlled by electromechanical devices with the functions of circuit breaking, load and line checking and protection.

These electromechanical devices consists of fuses, relays, breakers, breakers with thermal or magnetical protection, contactors, voltmeters, ammeters and relevant similar units. They have normally great over-all dimensions and weights, and produce electromagnetic noise with the closing/opening of contacts.

These devices must be manually reset after their operation and are often subjected to problems caused by oxidation of the contacts.

SUMMARY AND OBJECTS OF THE INVENTION

An aim of this invention is to present a solid state distribution system or DSC system for electrical installations operating with DC voltages and having all of the functions that actual electromechanical devices have, but in a more profitable system.

Another aim of this Invention is to introduce the DSC system as a continuously measuring system for electrical circuit parameters, with immunity to electrostatic discharge noise, compliance with EMC rules, and full protection against over voltages and short-circuit situations or anomalous current behavior.

Another aim of the invention is to present a modular DSC system with a range of current handling capabilities, selectably based on the application, with reduced overall dimensions and weights with respect to actual electromechanical devices, resistance to temperature and vibration, and which can be remotely controlled.

These aims are obtained with a DSC system completely based on solid state technology, controlled by electronics and connectable to a computer for remote control.

Using a DSC system inserted in a low voltage DC electrical line, it is possible to:

measure the current intensity flowing through a load;
measure the voltage across a load;
measure the operating temperature of the DSC system;
check the connected/disconnected status of a load;
checking the DSC system itself on a basis of voltage and temperature; and
operate in a remote mode or in manual mode.

With respect to actual electromechanical devices, the DSC system here described offers the followings advantages:

current load controls;
temperature controls;
lack of the electric arc during opening/closing of contacts;
lack of mechanical contacts and relevant problems;
very short operating times;
lack of EMC noise;
resistance to vibration and temperature;
reduction of overall dimensions and weights;
lower cost for mass production;
lower installation costs from reduced wiring;
lower maintenance costs if used with a remote connection to a central computer; and
a higher level of electrical installation and operation safety for operators.

With others advantages, the DSC system, based on a solid state power switch, can be connected to an external electronic system that can monitor any physical parameter like current, voltage, temperature, and circuit and load condition. The monitored physical parameters can be recorded to obtain a history of activations or malfunctions, or to trigger an immediate warning alarm.

Moreover, the DSC system can be mounted in a standard electrical cabinet in place of electromechanical devices.

By connecting the DSC system in a position near an electrical DC power source, it is possible to obtain a special function of the device called a battery breaker.

High current handling ability can easily be obtained with DSC systems connected in a parallel mode. Utilization of remote control can also allow installation of a DSC system in a narrow space while control is easily maintained from a location such as a main desk.

The DSC system proposed has been designed to be modular, that is to say composed from one or more DSC modules (10), also connectable in a parallel mode. Each DSC module can be programmed for different currents ranging from 10 to 100 Amperes.

Parallel connections can be made in order to obtain higher currents than would otherwise be available with single connections.

The DSC module is realized to be used in two separate and different modes.

In the first mode, the DSC module is controlled by an electronic circuit and functionally equivalent to a annual breaker protected by a resettable fuse.

The DSC module can be easily installed instead of mechanical fuses because it's mechanical dimensions are close to the standard for electrical cabinet installation.

In this use mode, the DSC module can be reset by a manual key and two lights that monitor the status of the DSC module. Inside the electronic circuit board there are two selectors to be set to program a range of current and a time delay if the load has a percentage of inductive component.

Over the allowable range of current programmed, the DSC module halts the current and protects the load from a short-circuit or higher current, or from out of range temperatures.

In the second mode the DSC module is remote controlled and the electronic circuit board contains a microcontroller with a memory. All of the characteristics of the manual mode are maintained but the controller memory can be programmed by using a dedicated program with parameters for a specific load like:

nominal load current;
percentage of tolerance over the nominal value of the current;
time to delay load activation or an alarm; and
maximum and minimum of admitted voltage.

The DSC modules in manual mode can be used independently like actual electromechnical breakers are used or connected in parallel mode to increase a range of the load current.

The DSC module in remote controlled mode can be combined in any way depending on the application which it is used for because of the presence of a microcontroller.

For example, in a particular application developed for the naval field, a DSC system can be used with 32 DSC modules with a current limited to 10 Amperes and 8 DSC modules with a current limited to 100 A each.

This solution is applicable in electrical installation on board little and medium range ships, where the distribution of load and the separation of lines is imposed by navigation rules, above all, for the safety of those on board.

The DSC system comprises the architecture design advantages of an on obard electrical installation with regard to weight, overall dimensions and reduced wiring complexity. The DSC offers these design advantages in an electrical installation where the electrical device of the ship is connected by a bus to a central operating unit.

The DSC system has been designed specifically for applications in the naval field.

All construction of the DSC is waterproof or water resistant, as well as vibration, temperature and oxidation protected.

The DSC system can also be enclosed in a protected metal cabinet without problems regarding heat dissipation It is designed and construction to obtain heat dissipation directly through the copper supports of each DSC module, and as such, the use of external blowers is not necessary in order to improve the reliability of the mechanical system through environmental protection and regulation.

In any case, if blowers should ever need to be used, they would only be necessary for higher current applications, and where there are high numbers of DSC modules inside a cabinet.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 shows a front view constructive layout of a DSC module; and

FIG. 2 shows the side view of the DSC module of FIG. 1.

DESCRIPTION OF THE PREFERRED EMBODIMENTS

Referring to the drawings in particular an example of a DSC module (10) is represented in the drawings of FIG. 1 and FIG. 2. The DSC module consists of two copper supports (11) and (12), a solid state switch (13), a printed circuit board (14) and an optional heat dissipator (15).

The copper supports (11) and (12) have connecting plugs (11') and (12') for clamping to the positive voltage bar (16) of the electrical line.

The solid state switch (13), yet know, is soldered on the copper support (11) and is connectable to the positive voltage bar (16).

The copper support (11) can be in contact with the optional heat dissipator (15) and is connected with the circuit electronic board (14) within the control electronics.

The solid state switch (13) is directly connected to the copper support (11) and the output power terminals (17) are connected to the U shaped silver leads (18).

The U shaped leads (18) have been designed to minimize the thermal stress on the leads of the solid state switch (13) and to obtain the highest conductivity by use of a silver material. The U shaped leads are connected to the second copper support (12). The clamping of conductors to the copper supports (11) and (12) may be obtained by using brass or copper screws and nuts.

The copper supports may eventually be soldered, or inserted nuts may be used to allow installation by hand with only one tool.

The DSC module is fitted with a connector (19) soldered to the printed circuit board (14) for remote control of the DSC module.

Instead of using a traditional heat dissipator (15), the copper supports (11), (12) and voltage bar (16) are shaped and dimensioned so they alone may be used to dissipate heat. The working of the DSC system is normally controlled by a microcontroller, but it may also be used in the first mode if manual operation is preferred.

When a level on the closing signal is activated, the DSC module switches and closes the circuit on the load. A return status signal is analyzed to know if the correct operation has been processed. Another analog signal can be used to monitor and measure the current flowing in a load.

Any combination of the previous signals can be used by the software to identify the working status of the DSC module and then alert the operator of a particular malfunction like current limiting, current short-circuit, increasing of temperature, load not connected, load not correct, undervoltage, overvoltage and over current.

All of the working statuses and parameters are programmed in the microcontroller memory and continuously checked by the electronics.

While specific embodiments of the invention have been shown and described in detail to illustrate the principles of the invention, it will be understood that the invention may be embodied otherwise without departing from such principles.

What is claimed is:

1. A solid state current distribution system for DC voltages, the system comprising:

a single electronic solid state switch for switching current from an input circuit powered by a voltage source to an output circuit connected to a load, a first copper support connected to the electronic switch and connectable to the input circuit, a printed circuit board for the control of the single electronic solid state switch, a second copper support connectable to the output circuit, wherein the single electronic solid state switch is directly electrically connected to the first copper support, the single electronic solid state switch has input terminals connected to the printed circuit board, the single electronic solid state switch has output terminals connected to the second copper support, the printed circuit board has the standard size of a mechanical fuse, and the printed circuit board and the first and the second copper supports are arranged in such a way the system presents a substantially flat or planar structure.

2. A solid state current distribution system according to claim 1, wherein the electronic solid state switch is soldered to the first copper support.

3. A solid state current distribution system according to claim 2, wherein the output terminals are soldered to the second copper support by means of U shaped leads.

4. A solid state current distribution system according to claim 2, wherein the printed circuit board includes an electronic circuit with a first selector to be set to program a range of current and a second selector to be set to program a time delay to be used if loads have an inductive component.

5. A solid state current distribution system according to claim 2, wherein the printed circuit board includes a microcontroller and a memory programmed for system management and recording parameters.

6. A solid state current distribution system according to claim 2, wherein the printed circuit board is provided with a connector for interfacing with an external computer to control and remotely monitor the current distribution system.

7. A solid state current distribution system according to claim 1, wherein the output terminals are soldered to the second copper support by means of U shaped leads.

8. A solid state current distribution system according to claim 1, wherein the printed circuit board includes an electronic circuit with a first selector to be set to program a range of current and a second selector to be set to program a time delay to be used if loads have an inductive component.

9. A solid state current distribution system according to claim 1, further comprising a reset connected to the electronic solid state switch for a manual resetting of the system.

10. A solid state current distribution system according to claim 1, wherein the printed circuit board includes a microcontroller and a memory programmed for system management and recording parameters.

11. A solid state current distribution system according to claim 10, configured as a module connectable in a parallel mode with one or more similar modules 12. A solid state current distribution system according to claim 11, wherein the module is programmable for different ranges of current.

13. A solid state current distribution system according to claim 1, configured as autonomous module.

14. A solid state current distribution system according to claim 13, wherein the module is programmable for different ranges of current.

15. A solid state current distribution system according to claim 1, wherein the printed circuit board is provided with a connector for interfacing with an external computer to control and remotely monitor the current distribution system.

16. A solid state current distribution system according to claim 1, further comprising a heat dissipator associated with the solid state switch.

17. A solid state current distribution system according to claim 1, wherein the input circuit includes a copper support bar, the copper support bar and the first and second copper supports are shaped and dimensioned as heat dissipators.

18. A solid state current distribution system according to claim 1, to be used in electrical installations for naval or industrial applications.

19. A solid state current distribution system according to claim 1, wherein the first and second copper supports are axially aligned and have main flat surfaces extending parallel to the printed circuit board.

20. A solid state current distribution system according to claim 1, wherein the electronic solid state switch is bent substantially at 90° in such a way that its head rests on the first copper support.

* * * * *